(12) United States Patent
Gupta

(10) Patent No.: US 11,455,326 B2
(45) Date of Patent: Sep. 27, 2022

(54) EFFICIENT STORAGE AND RETRIEVAL OF TEXTUAL DATA

(71) Applicant: MICROSOFT TECHNOLOGY LICENSING, LLC, Redmond, WA (US)

(72) Inventor: Vipul Gupta, Bangalore (IN)

(73) Assignee: Microsoft Technology Licensing, LLC, Redmond, WA (US)

( * ) Notice: Subject to any disclaimer, the term of this patent is extended or adjusted under 35 U.S.C. 154(b) by 555 days.

(21) Appl. No.: 16/517,599

(22) Filed: Jul. 21, 2019

(65) Prior Publication Data

US 2021/0019340 A1    Jan. 21, 2021

(51) Int. Cl.

| G06F 16/00 | (2019.01) |
|---|---|
| G06F 16/35 | (2019.01) |
| G06F 16/338 | (2019.01) |
| G06F 40/284 | (2020.01) |
| G06K 9/62 | (2022.01) |
| H03M 7/30 | (2006.01) |

(52) U.S. Cl.
CPC .......... *G06F 16/355* (2019.01); *G06F 16/338* (2019.01); *G06F 40/284* (2020.01); *G06K 9/6215* (2013.01); *H03M 7/30* (2013.01)

(58) Field of Classification Search
CPC .... G06F 40/284; G06F 16/355; G06F 16/338; G06K 9/6215; H03M 7/03
See application file for complete search history.

(56) References Cited

U.S. PATENT DOCUMENTS

| 4,597,057 | A | * | 6/1986 | Snow | G06F 40/242 |
| | | | | | 341/60 |
| 5,561,421 | A | * | 10/1996 | Smith | G06T 9/005 |
| | | | | | 341/106 |
| 5,704,060 | A | * | 12/1997 | Del Monte | H03M 7/30 |
| 5,729,228 | A | * | 3/1998 | Franaszek | G06T 9/005 |
| | | | | | 341/106 |
| 5,740,801 | A | * | 4/1998 | Branson | G06T 5/00 |
| | | | | | 600/407 |
| 5,920,854 | A | * | 7/1999 | Kirsch | G06F 16/951 |

(Continued)

OTHER PUBLICATIONS

"Columnar Storage", Retrieved from: https://web.archive.org/web/20190523215918/https:/docs.aws.amazon.com/redshift/latest/dg/c_columnar_storage_disk_mem_mgmnt.html, May 23, 2019, 3 Pages.

(Continued)

*Primary Examiner* — Leslie Wong
(74) *Attorney, Agent, or Firm* — NovoTechIP International PLLC

(57) ABSTRACT

A method of and system of efficient storage of data entries containing textual data is disclosed. The method may include accessing a plurality of data entries in a dataset, arranging the plurality of data entries in the dataset in a lexical order, placing a predetermined number of the plurality of data entries in each of a plurality of subblocks, performing data compression on the plurality of data entries in each of the plurality of subblocks to reduce redundancy in the plurality of data entries and create compressed data entries, placing one or more subblocks in each of a plurality of page blocks, and storing each of the plurality of page blocks in a storage device to provide efficient searching and improved functionality for the dataset.

20 Claims, 10 Drawing Sheets

(56) References Cited

U.S. PATENT DOCUMENTS

| | | | |
|---|---|---|---|
| 7,124,141 B2* | 10/2006 | Norcott | G06F 16/2455 |
| | | | 707/769 |
| 9,160,611 B2 | 10/2015 | Harris et al. | |
| 9,385,748 B2 | 7/2016 | Dalton et al. | |
| 9,558,241 B2* | 1/2017 | Harris | H04L 29/12594 |
| 9,977,802 B2 | 5/2018 | Florendo et al. | |
| 10,235,377 B2 | 3/2019 | Mueller et al. | |
| 2009/0150355 A1* | 6/2009 | Garfinkle | G06F 16/2264 |
| 2010/0030793 A1* | 2/2010 | Cooper | G06F 16/2282 |
| | | | 707/602 |
| 2011/0004639 A1* | 1/2011 | Williams | H03M 7/30 |
| | | | 707/812 |
| 2011/0246503 A1* | 10/2011 | Bender | G06F 16/258 |
| | | | 707/769 |
| 2015/0142819 A1* | 5/2015 | Florendo | G06F 16/22 |
| | | | 707/741 |
| 2016/0055213 A1* | 2/2016 | Harris | G06F 16/21 |
| | | | 707/693 |
| 2018/0011892 A1 | 1/2018 | Kimura | |
| 2018/0314750 A1* | 11/2018 | Merriman | G06F 16/278 |
| 2019/0138519 A1* | 5/2019 | Kavas | G06F 16/93 |
| 2020/0142868 A1* | 5/2020 | Varadarajan | G06F 3/0607 |
| 2021/0286783 A1* | 9/2021 | Armangau | G06F 16/215 |

OTHER PUBLICATIONS

"Database In-Memory Guide", Retrieved from: https://web.archive.org/web/20190726203857/https://docs.oracle.com/en/database/oracle/oracle-database/12.2/inmem/in-memory-column-store-architecture.html, Jul. 26, 2019, 22 Pages.

Kasai, et al., "Linear-Time Longest-Common-Prefix Computation in Suffix Arrays and Its Applications", In Proceedings of 12th Annual Symposium on Combinatorial Pattern Matching, Jul. 1, 2001, pp. 181-192.

Muller, et al., "Adaptive String Dictionary Compression in In-Memory Column-Store Database Systems", In Proceedings of the 17th International Conference on Extending Database, Mar. 24, 2014, pp. 283-294.

Bell, et al., "Data Compression in Full-Text Retrieval Systems", In Journal of the American Society for Information Science vol. 44 Issue 9, Oct. 1, 1993, pp. 508-531.

"International Search Report and Written Opinion Issued in PCT Application No. PCT/US20/035793", dated Sep. 21, 2020, 12 Pages.

* cited by examiner

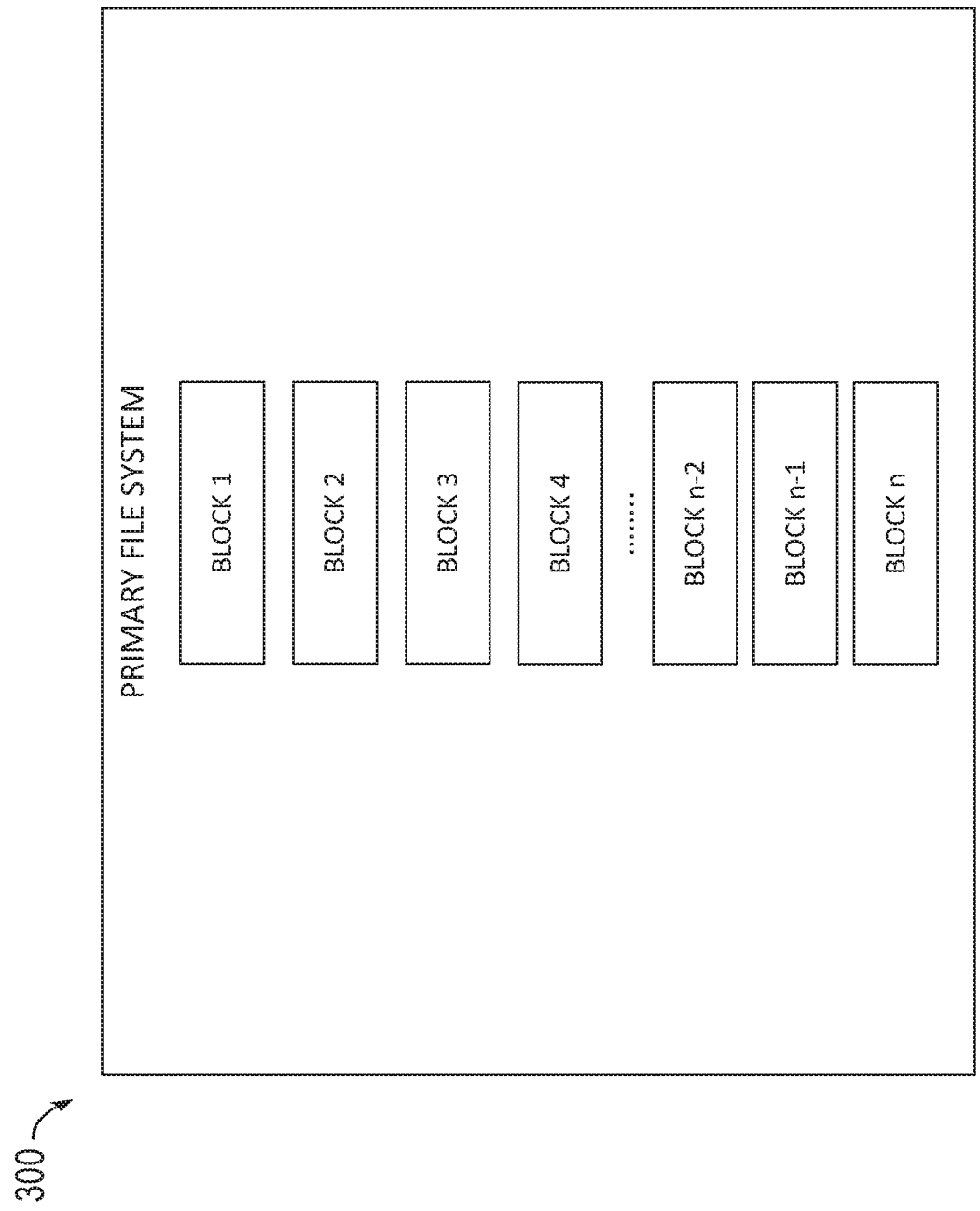

EFFICIENT STORAGE AND RETRIEVAL OF TEXTUAL DATA

TECHNICAL FIELD

This disclosure relates generally to efficient storing and retrieving of textual data and, more particularly, to an improved method of and system for efficiently storing and retrieving data that contains text in a cloud computing environment.

BACKGROUND

With the significant amount of data stored in cloud computing systems, the amount of storage space available is often scarce. Moreover, because of the large data sets that store data, it is often time-consuming and resource-intensive to search for, identify and retrieve desired data in dataset stored in the cloud computing system. This results in certain tasks becoming unduly burdensome. For example, when the amount of data in a dataset is significantly large, performing analytics on the dataset becomes very resource intensive. This may be particularly true for non-relational data structures such as columnar data structures that contain text.

Hence, there is a need for an improved method and system for efficiently storing, searching and retrieving textual data in a cloud computing environment.

SUMMARY

In one general aspect, the instant application describes a device having a processor and a memory in communication with the processor where the memory comprises executable instructions that, when executed by the processors, cause the device to perform multiple functions. The function may include may include accessing a plurality of data entries in a dataset, arranging the plurality of data entries in the dataset in a lexical order, placing a predetermined number of the plurality of data entries in each of a plurality of subblocks, performing data compression on the plurality of data entries in each of the plurality of subblocks to reduce redundancy in the plurality of data entries and create compressed data entries, placing one or more subblocks in each of a plurality of page blocks, and storing each of the plurality of page blocks in a storage device to provide efficient searching and improved functionality for the dataset.

In yet another general aspect, the instant application describes a method for efficient storage of data entries containing textual data. In one implementation, the method may include accessing a plurality of data entries in a dataset, arranging the plurality of data entries in the dataset in a lexical order, placing a predetermined number of the plurality of data entries in each of a plurality of subblocks, performing data compression on the plurality of data entries in each of the plurality of subblocks to reduce redundancy in the plurality of data entries and create compressed data entries, placing one or more subblocks in each of a plurality of page blocks, and storing each of the plurality of page blocks in a storage device to provide efficient searching and improved functionality for the dataset.

In a further general aspect, the instant application describes a non-transitory computer readable medium on which are stored instructions that when executed cause a programmable device to access a plurality of data entries in a dataset, arrange the plurality of data entries in the dataset in a lexical order, place a predetermined number of the plurality of data entries in each of a plurality of subblocks, perform data compression on the plurality of data entries in each of the plurality of subblocks to reduce redundancy in the plurality of data entries and create compressed data entries, place one or more subblocks in each of a plurality of page blocks, and store each of the plurality of page blocks in a storage device to provide efficient searching and improved functionality for the dataset.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

FIGS. 3A-3B depict examples of organizing data structure blocks in a primary file system for storing data.

DETAILED DESCRIPTION

Figure 1:
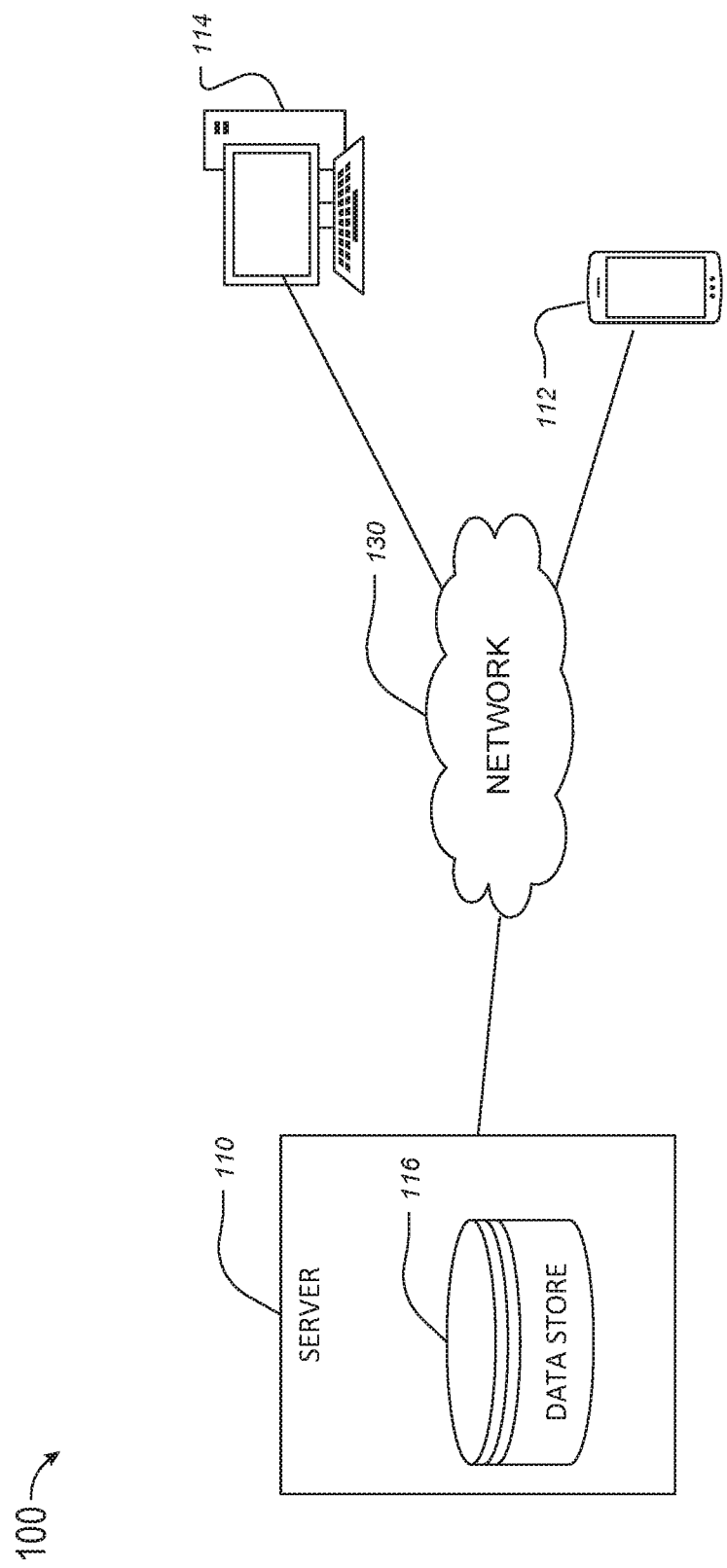
FIG. 1 depicts an example system upon which aspects of this disclosure may be implemented.

In the following detailed description, numerous specific details are set forth by way of examples in order to provide a thorough understanding of the relevant teachings. It will be apparent to persons of ordinary skill, upon reading this description, that various aspects can be practiced without such details. In other instances, well known methods, procedures, components, and/or circuitry have been described at a relatively high-level, without detail, in order to avoid unnecessarily obscuring aspects of the present teachings.

In today's computing environments, there is often a need to store large amounts of data in cloud computing systems. Examples of such data include textual data such as strings that make up dictionaries of different world languages or data written in natural languages as plain text strings. This data is then frequently searched by, for example, performing full-text searches on all or part of the stored data. It is often important to users that the search can be conducted quickly and efficiently. Presently available processes for data compression that operate uniformly on all types of stored data may not operate well on textual data. Furthermore, because of unique properties of text stings, this type of data may be better suited for alternative methods of compression and decompression.

To address these technical problems and more, in an example, this description provides a technical solution for an efficient method of storage and searching of data entries containing textual data (e.g., data strings). To improve the current methods of data storage, the technical solution makes use of two separate data structures, a primary file system and a secondary data structure. The primary file system may offer a highly efficient compression technique where data strings are sorted and stored in a lexical order. Ordering the data entries in a lexical order enables the system to use compression (e.g., delta compression) techniques to eliminate overlapping characters. The data entries may then be divided into a plurality of subblocks, where each subblock contains a predetermined number of data entries. The subblocks may be in lexical order, and each set of subblocks may form a physical page block. Because the subblocks are in a lexical order, what beginning characters a subblock starts and ends with may be easily decipherable. This results in providing a very efficient mechanism for performing searches. Thus, the technical solution not only offers a very efficient mechanism for compressing and storing data entries that contain textual data, but it also provides a quick and efficient solution for searching the stored data.

The secondary data structure offered by the technical solution may be used to maintain and allow incoming mutations, updates, or create requests. This may prevent the primary file system and the storage device it is stored on to not suffer from memory use efficiencies such as unnecessary locks, mutations and alterations. Instead, updates may be moved to one or more overflow pages. This process may function particularly well for storing textual data such as strings in a dictionary since once the original dictionary is stored, new updates and additions are rare. As a result, the technical solution provides a time and resource efficient mechanism for storing and searching a large number of data entries containing textual data (e.g., strings).

As will be understood by persons of skill in the art upon reading this disclosure, benefits and advantages provided by such technical solutions can include, but are not limited to, a solution to the technical problems of inefficient, resource-intensive storage and searching of large datasets containing textual data in a computer environment. Technical solutions and implementations provided herein optimize and improve the process of compressing and storing data. In particular, the technical solution enables more effective storage of textual data and provides for faster and more efficient searching of the stored data, thus resulting in an overall much improved storage system and process. The benefits provided by these technical solutions include providing increased efficiency, increased usability of the systems by conserving resources, and quicker search results.

FIG. 1 illustrates an example system 100, upon which aspects of this disclosure may be implemented. The system 100 may include a server 110 which may be connected to or include a data store 116 to which data may be stored. The system 100 may also include client computer devices 112 and 114 connected to the server 110. The client computers 112 and 114 may be used to conduct searches on or modify the data in the data store. The data store 116, and client computer devices 112 and 114 may be connected locally to the server 110, connected via the network 130 or connected via one or more separate networks. It should be noted that although only one server and data store are shown for simplicity, the system 100 may include a plurality of servers and data stores across which data is stored. Furthermore, client computers 112 and 114 merely example client devices that are connected to or may access the data in the data store 116.

The client devices 112 and 114 may be personal or handheld computing devices having both input elements and output elements. For example, the client devices 112 and 114 may be one of: a mobile telephone; a smart phone; a tablet; a phablet; a smart watch; a wearable computer; a personal computer; a desktop computer; a laptop computer; a gaming device/computer; a television; and the like. This list is for example purposes only and should not be considered as limiting. In one implementation, the client devices 112 and 114 may be servers. The internal hardware structure of a client device is discussed in greater detail in regard to FIGS. 8 and 9.

The network 110 may be a wired or wireless network or a combination of wired and wireless networks that connects one or more elements of the system 100. A user may be able to access the data store 116 and/or make changes to it via the client devices 112 and 114. For example, the user may access the data store 116, search for elements within the data store 116 and/or modify one or more data entities of the data store.

The data store 216 may include a plurality of datasets that can be searched, accessed, or modified. The datasets may include relational data sets (e.g., structured query language (SQL) data sets), having for example a large number of rows per table, or non-relational data sets (NoSQL) for example columnar datasets for storing textual data. Thus, the system 100 can be used to support a large database storage and retrieval system, for example, in a cloud computing environment. Data within the datasets may be accessed by the client devices 114 and 112 via one or more applications. The applications may be any user application that provides access to the underlying data.

Figure 2:
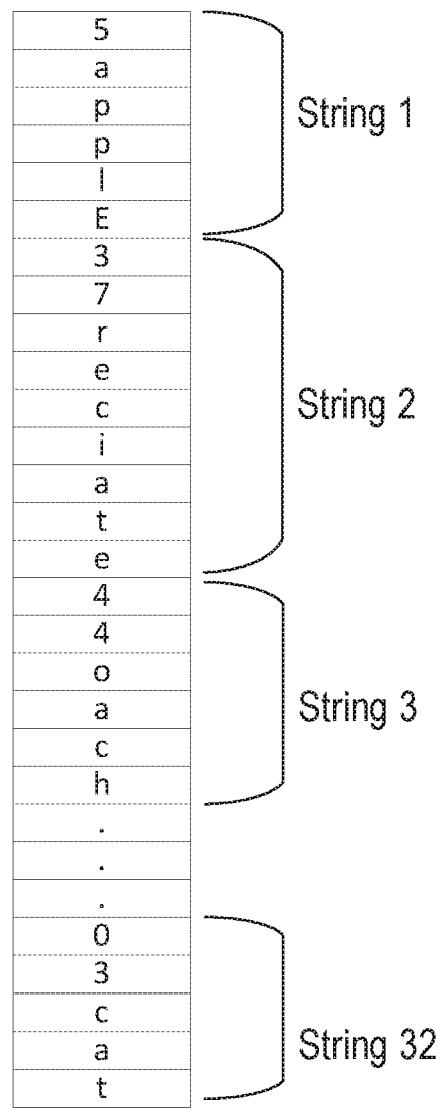
FIG. 2 depicts an example data structure block for storing textual data in a data set.

FIG. 2 depicts an example data structure block for storing textual data in a dataset. In an implementation, the primary file system for storing textual data is divided into a plurality of subblocks each of which contains a predetermined number of textual data strings. In this manner, each of the subblocks may contain the same number of data strings. In an example, the number of data strings in each subblock is 32. Thus, the file system block 200 of FIG. 2 may include 32 contextual data strings. Any other number of data strings may be selected for structuring the blocks.

Because textual data strings in a dataset are often not of the same length, it would be advantageous to compress the primary data strings in a way that makes good utilization of the space, while providing fast lookup capabilities. In an example, the technical solution achieves this by first organizing the data strings in each subblock in a lexical order. As depicted in the file system 200, the data strings in each subblock may be organized in a lexical order such that the data strings are alphabetically ordered based on the alphabetical order of their component letters. This enables the file system to eliminate repetitive characters between consecutive strings.

In one implementation, elimination of repetitive characters is achieved by comparing each data string to the previous data string in the sorted lexical order and identifying any beginning characters that are the same as the beginning characters of the previous data string. For example, the file system block 200 contains the data strings apple, appreciate, approach, . . . cat. In comparing the data string "appreciate" with the previous data string "apple," it may be determined that both strings include the beginning characters "app." As a result, instead of repeating those characters, the data string for "appreciate" may be compressed to eliminate them. This may be achieved by starting each string in the dataset with the number of repetitive characters in that string, followed by the number of unrepetitive characters and finally a listing of the unrepetitive characters. For example, the compressed data string for "appreciate" may begin with the number 3 to indicate that the first three characters of this string are the same as the first three characters of the previous string. This number is followed by the number 7 which is the number of remaining characters in the data string followed by the remaining characters. Thus, instead of storing the string "appreciate," the file system can store the string "37reciate." Similarly, the data string for approach may be converted to "44oach" indicating the first four characters are the same as the ones in the previous string "appreciate," while the four remaining characters are "aoch." If there are no repetitive characters in a data string, then the first number may be zero, followed by the total number of characters in the string. This is shown in the string 32 of the file system block 200 where the data string "cat" is converted to "03cat." Because the first data string in a block is not compared to a previous data string, the first data string may only include the number of characters in the data string, as shown by the compressed data entry for "apple" which is converted to "5apple."

In this manner, the technical solution may provide a cost and space efficient system to store textual data by converting each data entry in a data structure subblock to a compressed data entry that begins with the length of the prefix the data entry has in common with the previous data string in the block (if the data string is the first in the block, then this will be the length of the data string). The next characters in the compressed data entry may be the number of remaining characters in the data string after the common prefix. This number may be added, unless the data string is the first in the subblock. The number of remaining characters may be followed by the actual remaining characters of the data string after the prefix characters with the previous data string are ignored. Because a large number of textual data strings that are lexically ordered include repetitive beginning characters, this approach provides an opportunity for a significant reduction in the number of characters stored in a data structure. This may be particularly useful in storing words in a dictionary since the words are strings of data that often begin with the same characters as the previous word, when in lexical order. Thus, the technical solution provides a significant reduction in the amount of memory required for storing textual data containing strings. It should be noted that although the compression technique discussed above relates to textual data (e.g., strings), other types of compression techniques may be used for compressing different types of data. For example, natural ordering mechanisms may be adapted for different types of data. These compression techniques may also be used in combination with the data structure and searching mechanisms discussed herein to increase efficiency in storage space and access to resources, as discussed further below.

Figure 3B:
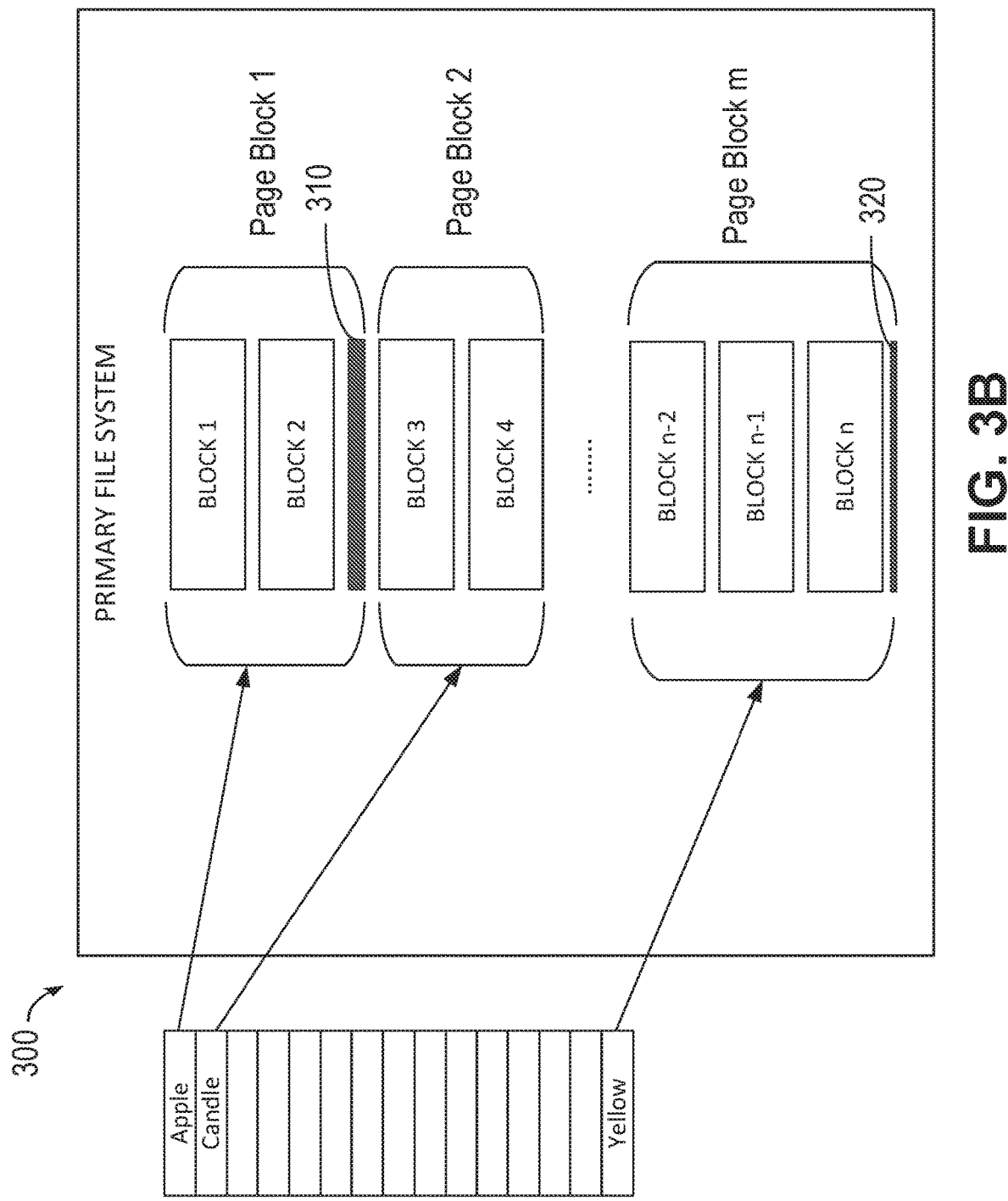

FIGS. 3A-3B depict examples of organizing data structure subblocks in a primary file system for storing data. As depicted in FIG. 3A, a primary file system 300 may include a plurality of subblocks (n blocks), organized in a lexical order. The total number of subblocks in a primary file system such as primary file system 300 may depend on the amount of data in the dataset and may change as the amount of data varies (e.g., data is deleted or added to the dataset). As discussed above, each of the subblocks in the primary file system may contain the same number of data entries. As a result, the size of the subblocks varies from each other, depending on the number of characters and the amount of compression in data strings of each block. Because of this, different number of subblocks may be grouped together to form a physical page block.

FIG. 3B depicts an example of assembling subblocks of the primary file system into physical page blocks. As depicted, each of the physical page blocks may contain a different number of subblocks. In one implementation, each physical page block corresponds to a page in memory. As is known in the art, a memory page may be a fixed-length contiguous block of memory which is described by a single entry in the memory page table. As a result, each page may be accessed from the memory in one page read. Because each physical page block may be a fixed-length block of memory (e.g., physical page blocks have the same size) and because the size of the subblocks vary, each physical page block may contain a different number of subblocks. This may also result in a certain number of physical page blocks including some empty space. For example, page block 1 of FIG. 3B includes the empty space 310, while page block m includes the empty space 320. As depicted, the sizes of the empty spaces 310 and 320 may vary and may depend on the sizes of subblocks in each physical page block.

In one implementation, the empty spaces 310 and 320 are reserved for future modifications of the subblocks. For example, if a future modification includes adding one or more data entries to a subblock and the new data entries are larger in size than the previously stored data entries in the subblock, the additional space may be used to modify the subblock without the need to rearrange how the subblocks are organized in the physical page blocks. In one implementation, overflow buckets and blocks are implemented in the empty spaces to prevent the need to rearrange the strings of a subblock in case of a change or addition. In an example, if the empty spaces overflow, one or more overflow pages are utilized for accommodating overflow of multiple different physical pages.

In another example, the empty spaces may be utilized to store metadata such as index caches, hit counts, and the like. If a need for using the empty space as an overflow space arises in the future, the data stored in the empty space may then be transferred to a different location in memory. In this manner, the technical solution may ensure highly efficient use of memory space.

As the subblocks in each physical page block are in a lexical order, the physical page blocks themselves are also in a lexical order. As a result, the first data string of each consecutive physical page block may be indicative of the content of physical page block. For example, when the first data string stored in page block 1 is the word "apple" and the first data string in page block 2 is the word "candle," this shows that all data strings that begin with letters in between the words "apple" and "candle" are located in page block 1. This leads to a very efficient mechanism for conducting searches in the primary file system.

In one implementation, a search in a column for a given value may start by the client giving the ID for the value to be searched. To conduct a search for the value in the primary file system, a binary search of the ID may be done at the physical page block level. Once the correct page block is located, a similar binary search may be performed to determine which of the subblocks contain the value. Again, because the subblocks are in a lexical order, it would be easy to determine just by examining the first data string in each subblock, which subblock a value may be located in. Once the correct subblock is identified, it may be scanned sequentially to locate the value searched for. Because each subblock only contains a limited number of data entries (e.g., 32 data strings), the process of sequentially scanning the subblock is still fast and efficient.

Figure 4:
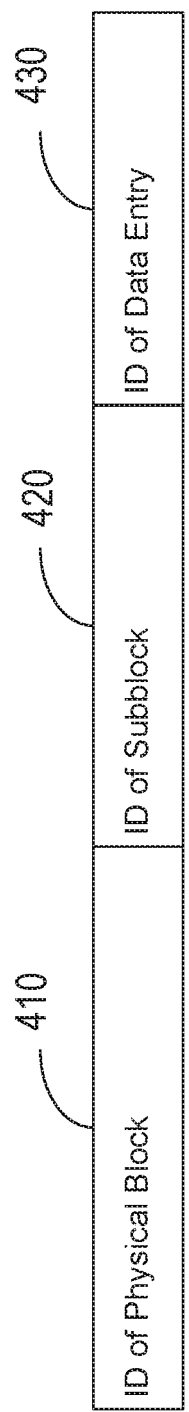
FIG. 4 depicts an example structure for creating a data entry ID.

In one implementation, to ensure searches can be conducted efficiently, a proper mechanism for identifying a data entry may include assigning an ID to each data entry. FIG. 4 depicts an example structure for creating a data entry ID. To ensure that the ID properly and quickly identifies the location of a data entry, it may include a portion 410 for identifying the physical block, a portion 420 for identifying the subblock, and a portion 430 for identifying the data entry in the subblock. Thus, the ID may be computed in three parts, with the first part maintaining the ID of the physical block, the second part the ID of the subblock and the third part the ID of the data entry string within the subblock. This may involve, for example, allocating a smaller number of bits for the location in the subblock, a larger number of bits for the location of the subblock and yet a larger number of bits for the location of the physical block. In an example, 5 bits may be used for the location of the data entry in the subblock (e.g., when 32 data entries are allocated to each subblock), 7 bits may be used for the subblock block number, and 20 bits may be used for the physical block ID. Utilizing these numbers may allow a data structure to store over 4 million data entries. By using an ID that includes identifications for each of the substructures that organize the data, the solution can ensure easy and efficient lookups.

In addition to the ID including three parts that enable efficient lookups, the ID may also easily enable the system to determine whether the value searched for is in the primary file system or the secondary file system. That is because an ID that is made up of three parts with each part being a bit representation of a location is an unsigned integer of a predetermined number of bits. When read as an integer, the ID would have an integer value. Because the values are sequential, the integer values may also be sequential. As a result, the IDs for the data entries stored in the primary file system would represent a range of integer values. Because it is easy to determine the integer value for the first and the last data entry in the primary file system, the range of IDs representing the data entries in the primary file system can be easily ascertained. Anything falling outside of that range can then be identified as not being located in the primary file system. Thus, a quick examination of the ID value for a searched term can determine whether the term is located in the primary file system or the secondary file system. That may provide an easy and efficient first level lookup to locate a searched term.

One of the ways in which the technical solution ensures efficiency is by providing a secondary data structure for managing modifications, updates, additions and/or create requests such that the primary file system and its corresponding memory do not suffer from unnecessary locks or alterations. In this manner, data modifications for the primary file system may be stored in the secondary data structure and implemented in batches. The changes may be implemented at infrequent time intervals when the system determines a need for making the change. For example, when the secondary data structure reaches a certain capacity level indicating that it may soon run out of space, the changes stored in the secondary data structure may be transferred to the primary file system. Once the transfer is complete, data entries in the secondary data structure may be removed to allow for future entries. In one implementation, merges between the data in the secondary data structure and the data in the primary file system may be conducted based on a predetermined time interval. In an example, in order to avoid changing IDs when a merge takes place, updates from the secondary data structure are moved to an overflow page and IDs for the updated data entries are generated accordingly. In this manner, by merely keeping a few overflow pages, the entire whole system can operate efficiently.

In an implementation, the primary file system and the secondary data structure operate in a similar manner as a two-level log-structured merge-tree (LSM tree). As is known in the art, a two-level LSM tree may include two tree-like structures, with one being smaller and entirely resident in memory, and the other one being stored on disk. New records may be inserted into the memory resident component until the insertion causes the component to exceed a certain size threshold. Once that limit is reached, a contiguous segment of entries may be removed from the smaller memory resident component and merged into the larger component on disk. The performance characteristics of LSM trees stem from the fact that each component is tuned to the characteristics of its underlying storage medium, and that data is efficiently migrated across media in rolling batches, using an algorithm reminiscent of merge sort.

The primary and secondary data structures utilized by the technical solution are similar to the LSM tree in that they include two data structure components with one being smaller than the other, and changes being stored in the smaller data structure component (secondary data structure) until they are transferred to the larger data structure in one or more batches. However, instead of having the smaller data structure in memory and the larger one on disk, the structure utilized in the technical solution may be applicable for optimizing in-memory structures for both primary and secondary data structures or for cases of in-memory secondary data structure and disk-based primary file system.

Because the secondary data structure is smaller in size than the primary file system and contains a limited number of data entries, it may not need to be compressed and optimized in the same manner as that of the primary file system. In fact, because of the smaller number of entries in the secondary data structure, the likelihood of having repetitive characters in consecutive data strings is not very high. As a result, using the compression techniques discussed above may not result in significant reduction in memory size. Because of this, in one implementation, the secondary data structure simply makes use of an array like data structure where entries are appended to the array as they come in.

Figure 5:
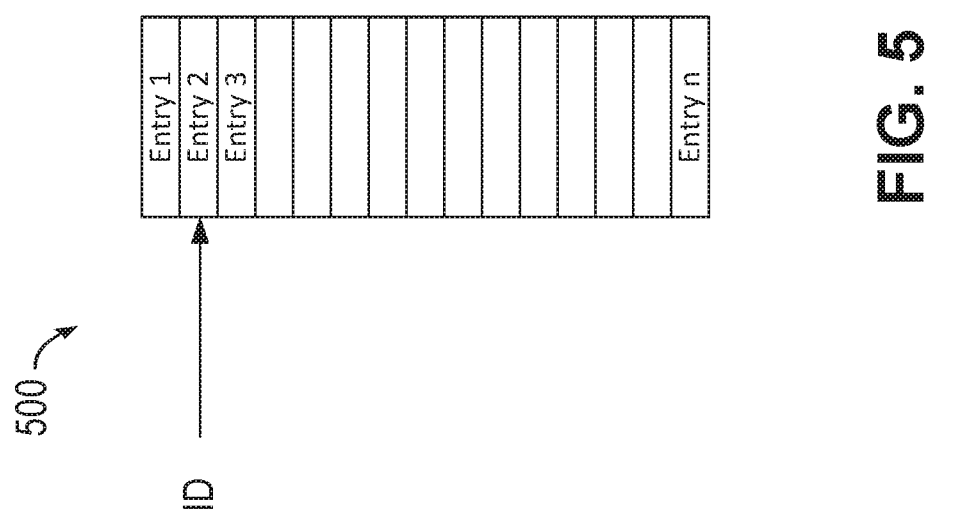
FIG. 5 depicts an example of an array data structure for storing data entries in the secondary data structure.

FIG. 5 depicts an examples array data structure 500 for storing data entries in the secondary data structure. The array structure 500 of the secondary data structure may simply include a one-dimensional array for storing data entries. In one implementation, each entry in the array has an associated ID. Each associated ID is then mapped to a value ID by a search tree to improve efficiency. In one implementation, an in-memory cache sensitive data structure may be used for the secondary data structure to achieve increased efficiency and high performance. Examples of types of caches that may be used include a HashSet with an amortized O(1) complexity or a binary tree cache with for example O(log n) complexity. This may involve maintaining multiple cache and range structures to perform quick direct ID to data entry lookups. The data structure may be a two-way cache structure that can provide lookups from an ID to a data entry and a data entry to an ID.

Figure 6:
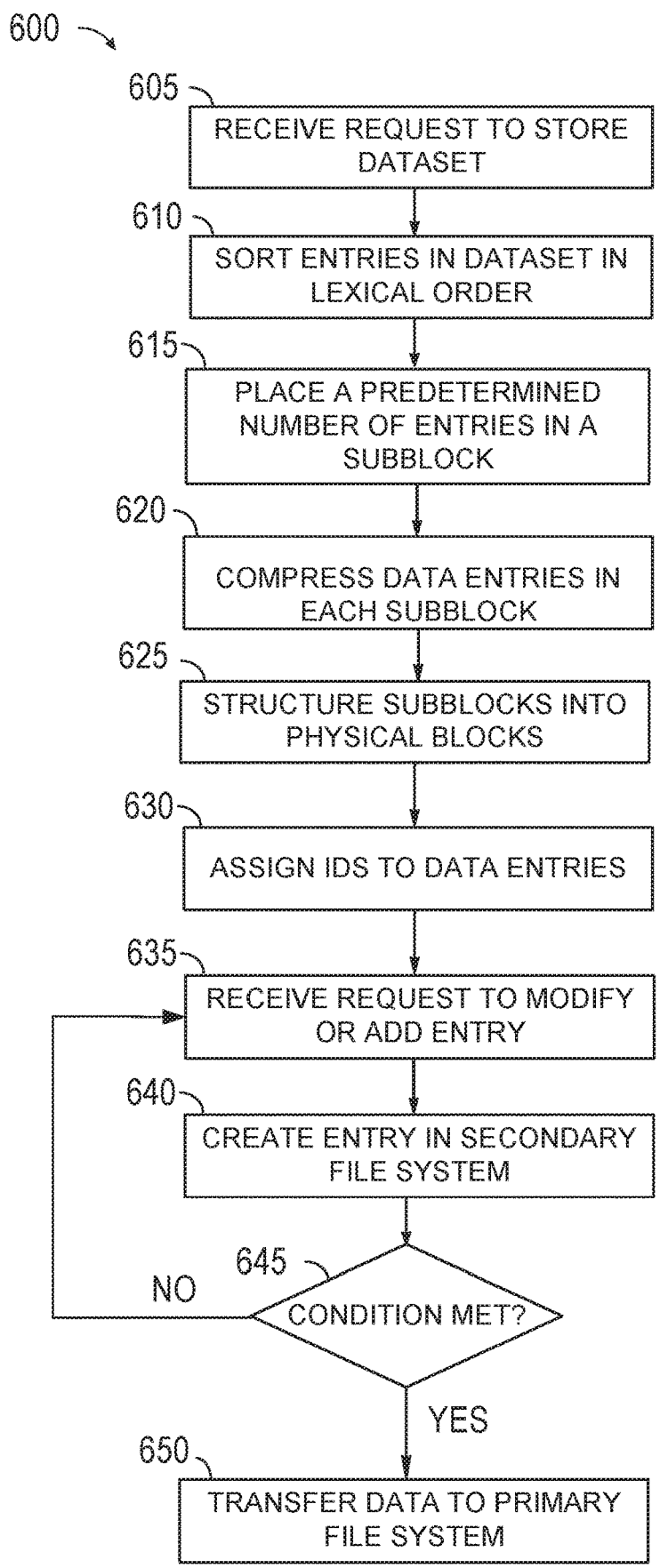
FIG. 6 is a flow diagram for efficiently storing data containing natural language text.

FIG. 6 is a flow diagram depicting an example method 600 for efficiently storing textual data. At 605, method 600 may begin by receiving a request to store a dataset. This may occur, for example, when a dataset is first presented for storage in a new storage device. Alternatively, the process may be initiated for turning an existing dataset into an improved data structure of the technical solutions discussed herein. In an example, the process may be initiated automatically as part of a restructuring of a data storage device.

Once a request to store the dataset has been received and processed, method 600 may proceed to sort the entries in the dataset in a lexical order, at 610. In this manner, all the available data entries containing textual data may be sorted in a lexical order for faster processing and compression. After, the data entries have been ordered lexically, they may be divided into sets of equal number of data entries to place each set in a subblock of the data structure, at 615. Thus, a predetermined number of data entries is placed in each subblock. The predetermined number may be selected based on optimization factors which may involve gathering empirical and/or experimental evidence before deciding what the optimal predetermined number is. In an example, the predetermined number is 32, resulting in each subblock having 32 data entries. It should be noted that the data entries maintain their lexical order when divided into subblocks. Thus, once created, the resulting subblocks may automatically be in lexical order.

After the data entries have been assigned to their respective subblocks, compression techniques, such as the compression process of method 700, discussed below, may be applied to the data entries to compress the entries in each subblock, at 620. Once the data entries are placed in respective subblocks and compressed, the subblocks may be structured into physical page blocks that maintain the lexical order, at 625. This may be done by dividing the subblocks into a plurality physical page blocks based on their size and the size of each physical page block. As discussed above, physical page blocks are of the same size. As a result, subblocks may be allocated to respective physical page blocks based on the size of each subblock and the remaining space available in a physical page block. This may result in different physical page blocks having different number of subblocks and having some additional empty space.

In addition to dividing the data entries into subblocks and physical blocks, method 600 may also include assigning IDs to each data entry, at 630, to ensure efficient lookup and retrieval of the data. The IDs may be assigned by taking into account, the physical block ID, the subblock ID and the location within a subblock a data entry is located in. Once IDs have been assigned to all data entries, method 600 may wait to receive a request to modify a data entry or add a data entry to the dataset, at 635. Since a request to modify or add a data entry may require significant change to the data structure, the request for modifying or adding a data entry may be processed by creating an entry in the secondary data structure, at 640. This prevents the primary file system from being negatively impacted every time a change to the underlying data needs to be made. Instead, changes may be stored in the secondary data structure until method 600 determines, at 645, that a condition for merging the secondary data structure with the primary file system has been made. In an example, the condition may be a determination that the secondary data structure has reached a predetermined capacity or that a predetermined time interval has passed since the previous merge.

When it is determined, at 645, that the condition has been met, method 600 may proceed to transfer the contents of the secondary data structure to the primary file system, at 650. This may involve the steps of organizing the data entries in the secondary data structure in a lexical order, examining the physical blocks and then the subblocks to determine where in the data structure a new data entry should be located in to maintain the lexical order, compressing the data entry before inserting it in a subblock, and reorganizing the remaining entries to maintain the order. Alternatively, the additional data entry may be inserted into overflow buckets of a physical page's empty space. If it is determined, at 645, that the condition has not been met, then method 600 may return to step 635 to wait for receiving the next request for modifying or adding a data entry.

Figure 7:
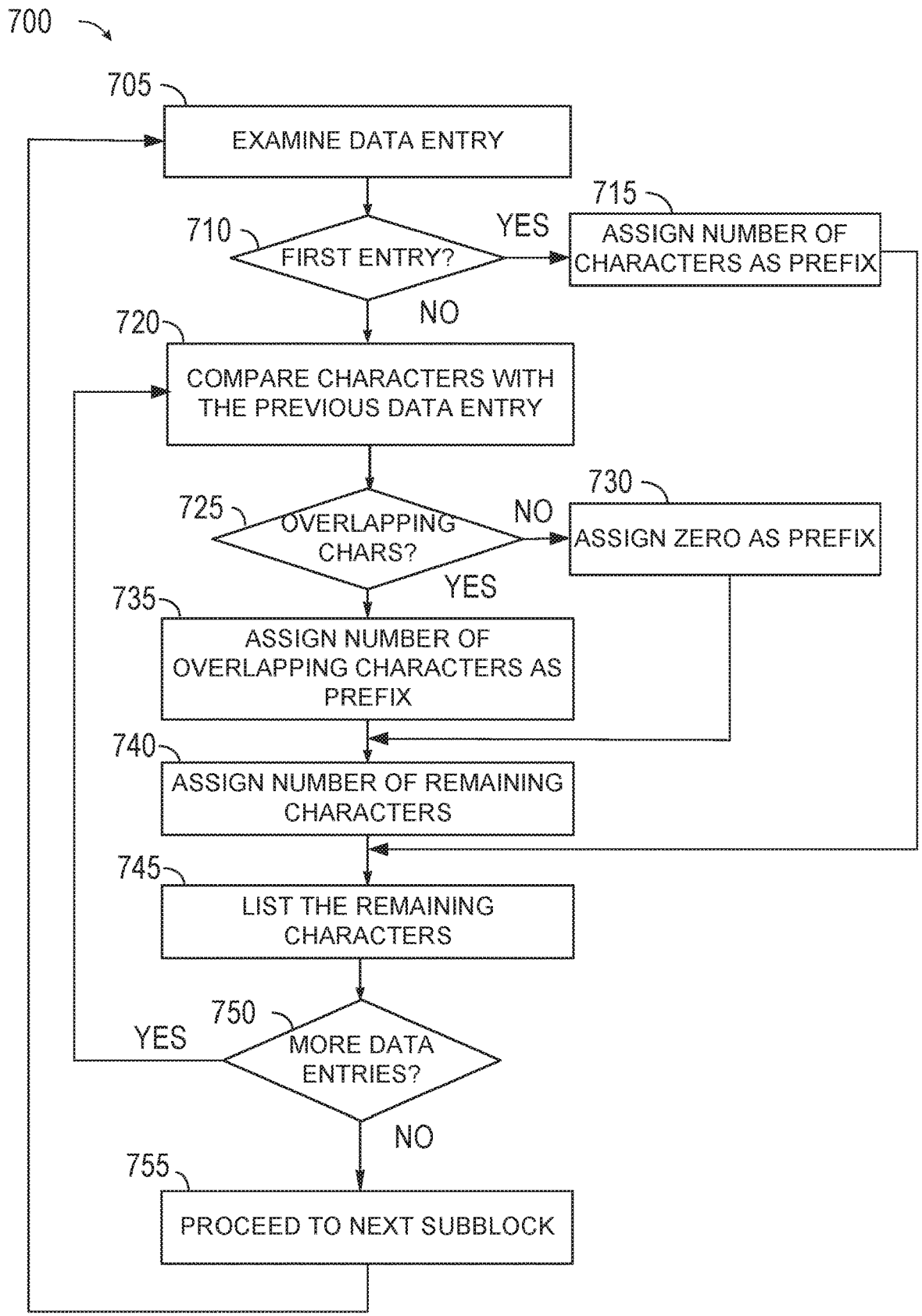
FIG. 7 is a flow diagram depicting an example method for efficiently compressing data entries for data containing natural language text.

FIG. 7 is a flow diagram depicting an example method 700 for efficiently compressing data entries for textual data. At 705, method 700 may begin by examining a data entry to determine if the data entry is the first data entry in a subblock, at 710. If is determined that the data entry is the first in the subblock, method 700 may proceed to assign the number of characters in the data entry (e.g., number of characters in the string) as the prefix for the compressed data entry, at 715. When, however, it is determined that the data entry is not the first in the subblock, method 700 may proceed to compare the current data entry to the previous one in the subblock, at 720, to determine if there are any overlaps in their beginning characters, at 725. If method 700 identifies any overlapping characters (e.g., the data entries begin with the same characters), method 700 may proceed to assign the number of overlapping characters as the prefix, at 735. When, however, no overlapping characters are identified, at 725, method 700 may proceed to assign the prefix of zero to the compressed data entry, at 730.

Once the prefix has been assigned, method 700 may proceed to assign the remaining number of characters in the received data entry to the compressed data entry, at 740. Depending on whether or not there are any overlapping characters, this number may be the same as the number of characters in the data entry or equal to the total number of characters in the data entry minus the number of overlapping characters. After the prefix and the remaining number of characters (for any entry other than the first data entry) have been assigned, method 700 may proceed to list the remaining characters in the data entry, at 745. This results in a new compressed data entry which consists of numbers and a listing of unrepeated characters.

Once the current data entry has been processed in this manner, method 700 may proceed to determine if there are any other uncompressed data entries in the current subblock, at 750. When it is determined that there are more data entries, method 700 may return to step 720 to compare the characters in the current data entry with the previous one and continue with the previously discussed steps as outlined above. If, however, it is determined that there are no more data entries in the current subblock, method 700 may proceed to the next subblock, at 755, before examining the data entry in the next subblock, at 705. The steps of method 700 may be repeated until the end of the subblocks is reached.

Thus, in different implementations, a technical solution is provided for an improved method and system of storing data entries in a data structure. The technical solution provides a compression mechanism for compressing data entries containing textual data (e.g., data strings that make up a dictionary) and offers a mechanism for easy and efficient searching of the resulting data structure. In one implementation, the data structure is divided into a primary file system and a secondary data structure to prevent memory use inefficiencies. Thus, the technical solution provides an efficient mechanism for storing, searching, and accessing data in a data structure for data entries containing textual data.

Figure 8:
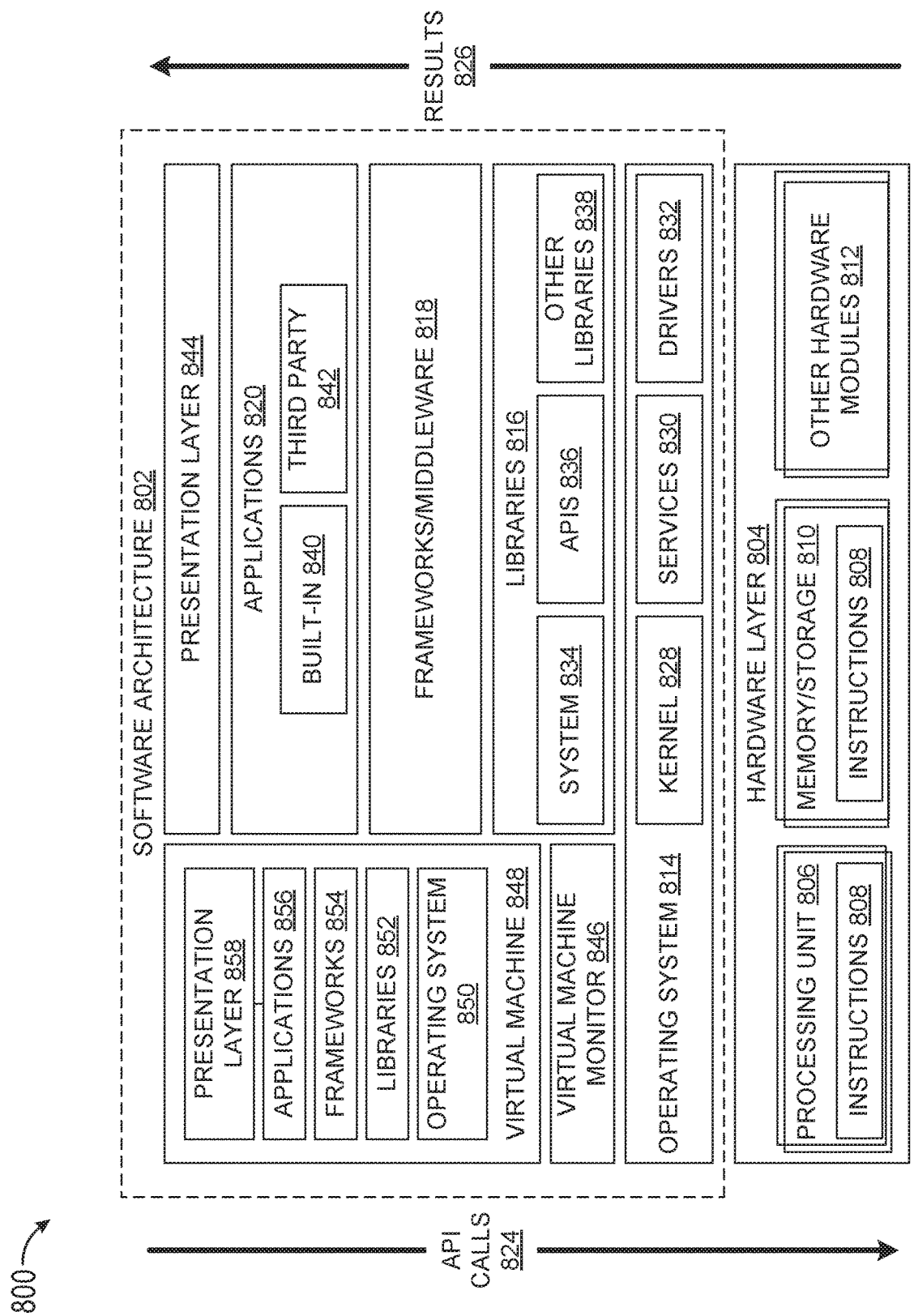
FIG. 8 is a block diagram illustrating an example software architecture, various portions of which may be used in conjunction with various hardware architectures herein described.

FIG. 8 is a block diagram 800 illustrating an example software architecture 802, various portions of which may be used in conjunction with various hardware architectures herein described, which may implement any of the above-described features. FIG. 8 is a non-limiting example of a software architecture and it will be appreciated that many other architectures may be implemented to facilitate the functionality described herein. The software architecture 802 may execute on hardware such as client devices, native application provider, web servers, server clusters, external services, and other servers. A representative hardware layer 804 includes a processing unit 806 and associated executable instructions 808. The executable instructions 808 represent executable instructions of the software architecture 802, including implementation of the methods, modules and so forth described herein.

The hardware layer 804 also includes a memory/storage 810, which also includes the executable instructions 808 and accompanying data. The hardware layer 804 may also include other hardware modules 812. Instructions 808 held by processing unit 808 may be portions of instructions 808 held by the memory/storage 810.

The example software architecture 802 may be conceptualized as layers, each providing various functionality. For example, the software architecture 802 may include layers and components such as an operating system (OS) 814, libraries 816, frameworks 818, applications 820, and a presentation layer 824. Operationally, the applications 820 and/or other components within the layers may invoke API calls 824 to other layers and receive corresponding results 826. The layers illustrated are representative in nature and other software architectures may include additional or different layers. For example, some mobile or special purpose operating systems may not provide the frameworks/middleware 818.

The OS 814 may manage hardware resources and provide common services. The OS 814 may include, for example, a kernel 828, services 830, and drivers 832. The kernel 828 may act as an abstraction layer between the hardware layer 804 and other software layers. For example, the kernel 828 may be responsible for memory management, processor management (for example, scheduling), component management, networking, security settings, and so on. The services 830 may provide other common services for the other software layers. The drivers 832 may be responsible for controlling or interfacing with the underlying hardware layer 804. For instance, the drivers 832 may include display drivers, camera drivers, memory/storage drivers, peripheral device drivers (for example, via Universal Serial Bus (USB)), network and/or wireless communication drivers, audio drivers, and so forth depending on the hardware and/or software configuration.

The libraries 816 may provide a common infrastructure that may be used by the applications 820 and/or other components and/or layers. The libraries 816 typically provide functionality for use by other software modules to perform tasks, rather than rather than interacting directly with the OS 814. The libraries 816 may include system libraries 834 (for example, C standard library) that may provide functions such as memory allocation, string manipulation, file operations. In addition, the libraries 816 may include API libraries 836 such as media libraries (for example, supporting presentation and manipulation of image, sound, and/or video data formats), graphics libraries (for example, an OpenGL library for rendering 2D and 3D graphics on a display), database libraries (for example, SQLite or other relational database functions), and web libraries (for example, WebKit that may provide web browsing functionality). The libraries 816 may also include a wide variety of other libraries 838 to provide many functions for applications 820 and other software modules.

The frameworks 818 (also sometimes referred to as middleware) provide a higher-level common infrastructure that may be used by the applications 820 and/or other software modules. For example, the frameworks 818 may provide various graphic user interface (GUI) functions, high-level resource management, or high-level location services. The frameworks 818 may provide a broad spectrum of other APIs for applications 820 and/or other software modules.

The applications 820 include built-in applications 820 and/or third-party applications 822. Examples of built-in applications 820 may include, but are not limited to, a contacts application, a browser application, a location application, a media application, a messaging application, and/or a game application. Third-party applications 822 may include any applications developed by an entity other than the vendor of the particular system. The applications 820 may use functions available via OS 814, libraries 816, frameworks 818, and presentation layer 824 to create user interfaces to interact with users.

Some software architectures use virtual machines, as illustrated by a virtual machine 828. The virtual machine 828 provides an execution environment where applications/modules can execute as if they were executing on a hardware machine (such as the machine 900 of FIG. 9, for example). The virtual machine 828 may be hosted by a host OS (for example, OS 814) or hypervisor, and may have a virtual machine monitor 826 which manages operation of the virtual machine 828 and interoperation with the host operating system. A software architecture, which may be different from software architecture 802 outside of the virtual machine, executes within the virtual machine 828 such as an OS 850, libraries 852, frameworks 854, applications 856, and/or a presentation layer 858.

Figure 9:
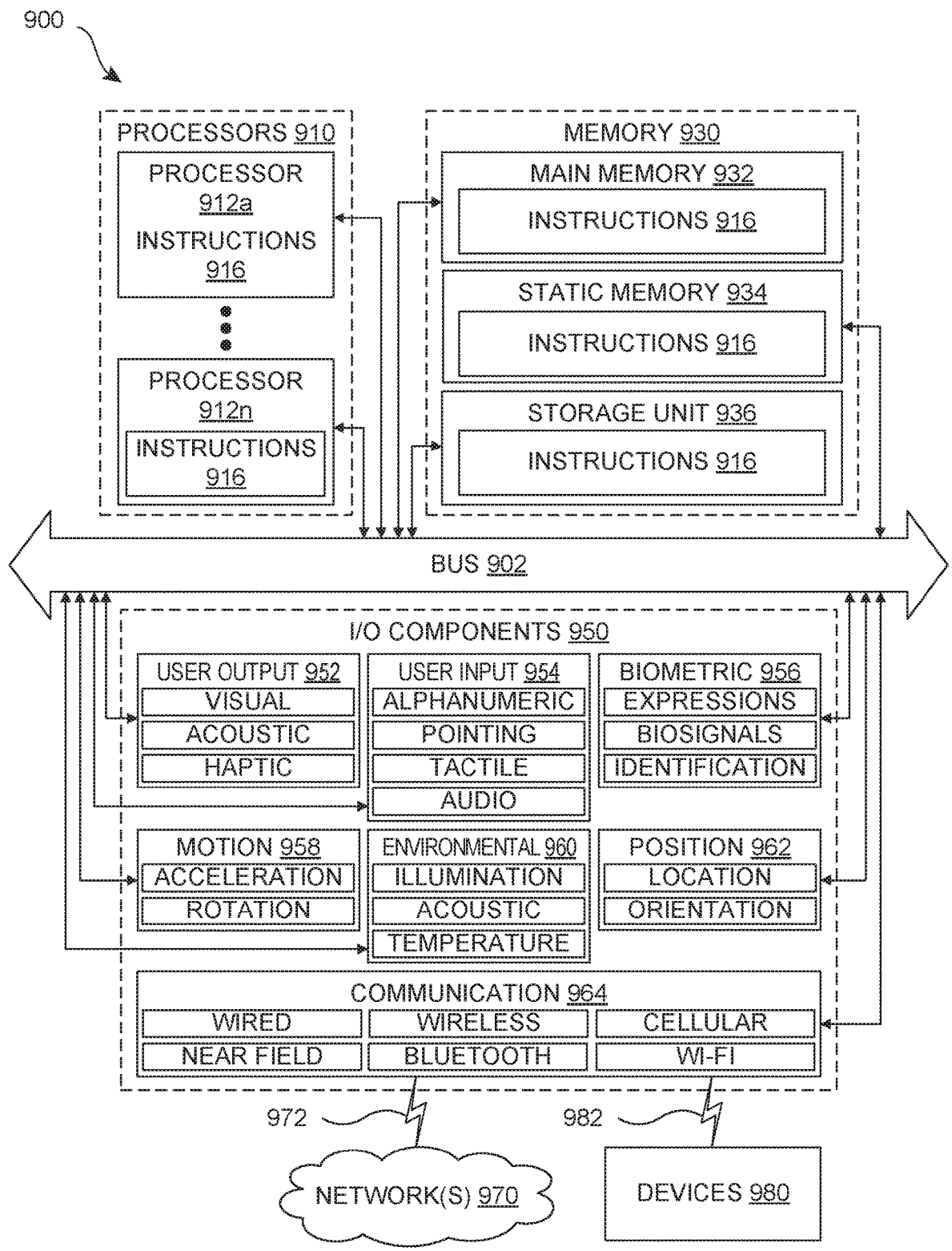
FIG. 9 is a block diagram illustrating components of an example machine configured to read instructions from a machine-readable medium and perform any of the features described herein.

FIG. 9 is a block diagram illustrating components of an example machine 900 configured to read instructions from a machine-readable medium (for example, a machine-readable storage medium) and perform any of the features described herein. The example machine 900 is in a form of a computer system, within which instructions 916 (for example, in the form of software components) for causing the machine 900 to perform any of the features described herein may be executed. As such, the instructions 916 may be used to implement methods or components described herein. The instructions 916 cause unprogrammed and/or unconfigured machine 900 to operate as a particular machine configured to carry out the described features. The machine 900 may be configured to operate as a standalone device or may be coupled (for example, networked) to other machines. In a networked deployment, the machine 900 may operate in the capacity of a server machine or a client machine in a server-client network environment, or as a node in a peer-to-peer or distributed network environment. Machine 900 may be embodied as, for example, a server computer, a client computer, a personal computer (PC), a tablet computer, a laptop computer, a netbook, a set-top box (STB), a gaming and/or entertainment system, a smart phone, a mobile device, a wearable device (for example, a smart watch), and an Internet of Things (IoT) device. Further, although only a single machine 900 is illustrated, the term "machine" includes a collection of machines that individually or jointly execute the instructions 916.

The machine 900 may include processors 910, memory 930, and I/O components 950, which may be communicatively coupled via, for example, a bus 902. The bus 902 may include multiple buses coupling various elements of machine 900 via various bus technologies and protocols. In an example, the processors 910 (including, for example, a central processing unit (CPU), a graphics processing unit (GPU), a digital signal processor (DSP), an ASIC, or a suitable combination thereof) may include one or more processors 912a to 912n that may execute the instructions 916 and process data. In some examples, one or more processors 910 may execute instructions provided or identified by one or more other processors 910. The term "processor" includes a multi-core processor including cores that may execute instructions contemporaneously. Although FIG. 9 shows multiple processors, the machine 900 may include a single processor with a single core, a single processor with multiple cores (for example, a multi-core processor), multiple processors each with a single core, multiple processors each with multiple cores, or any combination thereof. In some examples, the machine 900 may include multiple processors distributed among multiple machines.

The memory/storage 930 may include a main memory 932, a static memory 934, or other memory, and a storage unit 936, both accessible to the processors 910 such as via the bus 902. The storage unit 936 and memory 932, 934 store instructions 916 embodying any one or more of the functions described herein. The memory/storage 930 may also store temporary, intermediate, and/or long-term data for processors 910. The instructions 916 may also reside, completely or partially, within the memory 932, 934, within the storage unit 936, within at least one of the processors 910 (for example, within a command buffer or cache memory), within memory at least one of I/O components 950, or any suitable combination thereof, during execution thereof. Accordingly, the memory 932, 934, the storage unit 936, memory in processors 910, and memory in I/O components 950 are examples of machine-readable media.

As used herein, "machine-readable medium" refers to a device able to temporarily or permanently store instructions and data that cause machine 900 to operate in a specific fashion. The term "machine-readable medium," as used herein, does not encompass transitory electrical or electromagnetic signals per se (such as on a carrier wave propagating through a medium); the term "machine-readable medium" may therefore be considered tangible and non-transitory. Non-limiting examples of a non-transitory, tangible machine-readable medium may include, but are not limited to, nonvolatile memory (such as flash memory or read-only memory (ROM)), volatile memory (such as a static random-access memory (RAM) or a dynamic RAM), buffer memory, cache memory, optical storage media, magnetic storage media and devices, network-accessible or cloud storage, other types of storage, and/or any suitable combination thereof. The term "machine-readable medium" applies to a single medium, or combination of multiple media, used to store instructions (for example, instructions 916) for execution by a machine 900 such that the instructions, when executed by one or more processors 910 of the machine 900, cause the machine 900 to perform and one or more of the features described herein. Accordingly, a "machine-readable medium" may refer to a single storage device, as well as "cloud-based" storage systems or storage networks that include multiple storage apparatus or devices.

The I/O components 950 may include a wide variety of hardware components adapted to receive input, provide output, produce output, transmit information, exchange information, capture measurements, and so on. The specific I/O components 950 included in a particular machine will depend on the type and/or function of the machine. For example, mobile devices such as mobile phones may include a touch input device, whereas a headless server or IoT device may not include such a touch input device. The particular examples of I/O components illustrated in FIG. 9 are in no way limiting, and other types of components may be included in machine 900. The grouping of I/O components 950 are merely for simplifying this discussion, and the grouping is in no way limiting. In various examples, the I/O components 950 may include user output components 952 and user input components 954. User output components 952 may include, for example, display components for displaying information (for example, a liquid crystal display (LCD) or a projector), acoustic components (for example, speakers), haptic components (for example, a vibratory motor or force-feedback device), and/or other signal generators. User input components 954 may include, for example, alphanumeric input components (for example, a keyboard or a touch screen), pointing components (for example, a mouse device, a touchpad, or another pointing instrument), and/or tactile input components (for example, a physical button or a touch screen that provides location and/or force of touches or touch gestures) configured for receiving various user inputs, such as user commands and/or selections.

In some examples, the I/O components 950 may include biometric components 956 and/or position components 962, among a wide array of other environmental sensor components. The biometric components 956 may include, for example, components to detect body expressions (for example, facial expressions, vocal expressions, hand or body gestures, or eye tracking), measure biosignals (for example, heart rate or brain waves), and identify a person (for example, via voice-, retina-, and/or facial-based identification). The position components 962 may include, for example, location sensors (for example, a Global Position System (GPS) receiver), altitude sensors (for example, an air pressure sensor from which altitude may be derived), and/or orientation sensors (for example, magnetometers).

The I/O components 950 may include communication components 964, implementing a wide variety of technologies operable to couple the machine 900 to network(s) 970 and/or device(s) 980 via respective communicative couplings 972 and 982. The communication components 964 may include one or more network interface components or other suitable devices to interface with the network(s) 970. The communication components 964 may include, for example, components adapted to provide wired communication, wireless communication, cellular communication, Near Field Communication (NFC), Bluetooth communication, Wi-Fi, and/or communication via other modalities. The device(s) 980 may include other machines or various peripheral devices (for example, coupled via USB).

In some examples, the communication components 964 may detect identifiers or include components adapted to detect identifiers. For example, the communication components 964 may include Radio Frequency Identification (RFID) tag readers, NFC detectors, optical sensors (for example, one- or multi-dimensional bar codes, or other optical codes), and/or acoustic detectors (for example, microphones to identify tagged audio signals). In some examples, location information may be determined based on information from the communication components 962, such as, but not limited to, geo-location via Internet Protocol (IP) address, location via Wi-Fi, cellular, NFC, Bluetooth, or other wireless station identification and/or signal triangulation.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

Generally, functions described herein (for example, the features illustrated in FIGS. 1-4) can be implemented using software, firmware, hardware (for example, fixed logic, finite state machines, and/or other circuits), or a combination of these implementations. In the case of a software implementation, program code performs specified tasks when executed on a processor (for example, a CPU or CPUs). The program code can be stored in one or more machine-readable memory devices. The features of the techniques described herein are system-independent, meaning that the techniques may be implemented on a variety of computing systems having a variety of processors. For example, implementations may include an entity (for example, software) that causes hardware to perform operations, e.g., processors functional blocks, and so on. For example, a hardware device may include a machine-readable medium that may be configured to maintain instructions that cause the hardware device, including an operating system executed thereon and associated hardware, to perform operations. Thus, the instructions may function to configure an operating system and associated hardware to perform the operations and thereby configure or otherwise adapt a hardware device to perform functions described above. The instructions may be provided by the machine-readable medium through a variety of different configurations to hardware elements that execute the instructions.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows, and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein.

Relational terms such as first and second and the like may be used solely to distinguish one entity or action from another without necessarily requiring or implying any actual such relationship or order between such entities or actions. The terms "comprises," "comprising," and any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly identify the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that any claim requires more features than the claim expressly recites. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A data processing system comprising:
   a processor; and
   a memory in communication with the processor, the memory comprising executable instructions that, when executed by the processor, cause the data processing system to perform functions of:
   accessing a plurality of data entries in a dataset;
   arranging the plurality of data entries in the dataset in a lexical order;
   placing a predetermined number of the plurality of data entries in each of a plurality of subblocks;

performing data compression on the plurality of data entries in each of the plurality of subblocks to reduce redundancy in the plurality of data entries and create compressed data entries;

placing one or more subblocks in each of a plurality of page blocks; and storing each of the plurality of page blocks in a storage device to provide efficient searching and improved functionality for the dataset, wherein performing data compression on the plurality of data entries in each of the plurality of subblocks comprises:

examining a data entry in a subblock to determine that the data entry is not a first data entry in the subblock;

upon determining that the data entry is not the first data entry in the subblock:

comparing the data entry to a previous data entry in the subblock to identify overlapping beginning characters; and assigning a number to a compressed data entry for the data entry, when one or more overlapping characters are identified.

2. The data processing system of claim 1, wherein the plurality of subblocks are in a lexical order.

3. The data processing system of claim 2, wherein the plurality of page blocks are in a lexical order.

4. The data processing system of claim 1, wherein performing data compression on the plurality of data entries in each of the plurality of subblocks to create compressed data entries further comprises:

upon determining that the data entry is not the first data entry in the subblock and comparing the data entry to the previous data entry in the subblock to identify overlapping beginning characters:

assigning a number zero to a prefix of the compressed data entry, when no overlapping beginning characters are identified;

assigning the number of overlapping characters to the prefix, when one or more overlapping characters are identified;

placing a number in the compressed data entry for characters other than the overlapping characters in the data entry; and listing the characters other than the overlapping characters in the compressed data entry; and determining if the data entry is the first data entry in a subblock and if yes, assigning a number of characters in the data entry as a prefix for the compressed data entry.

5. The data processing system of claim 1, wherein each of the plurality of subblocks has a same number of data entries.

6. The data processing system of claim 1, wherein two page blocks have different numbers of subblocks.

7. The data processing system of claim 1, wherein one of the plurality of page blocks includes empty memory space.

8. The data processing system of claim 1, wherein the plurality of subblocks and the plurality of page blocks comprise a primary file system.

9. The data processing system of claim 8, wherein the executable instructions when executed by the processor, further cause the device to perform functions of creating a secondary data structure for temporary storage of data entries which require a change to the primary file system after the primary file system has been created.

10. The device of claim 9, wherein the executable instructions when executed by the processor, further cause the device to perform functions of:

receiving a request to perform a search for a value in the dataset, the request including an ID;

determining if the ID is in a range of IDs assigned to the primary file system;

upon determining that the ID is in a range of IDs assigned to the primary file system:

performing a binary search to locate the page block and the subblock in which the value is located; and upon locating the subblock in which the value is located, performing a sequential search of the subblock to locate the value; and upon determining that the ID is outside the range of IDs assigned to the primary file system, performing a search of the secondary data structure to locate the value.

11. A method for efficient storage of data entries containing textual data, comprising:

accessing a plurality of data entries in a dataset;

arranging the plurality of data entries in the dataset in a lexical order;

placing a predetermined number of the plurality of data entries in each of a plurality of subblocks;

performing data compression on the plurality of data entries in each of the plurality of subblocks to reduce redundancy in the plurality of data entries and create compressed data entries;

placing one or more subblocks in each of a plurality of page blocks; and storing each of the plurality of page blocks in a storage device to provide efficient searching wherein performing data compression on the plurality of data entries in each of the plurality of subblocks comprises:

examining a data entry in a subblock to determine that the data entry is not a first data entry in the subblock;

upon determining that the data entry is not the first data entry in the subblock:

comparing the data entry to a previous data entry in the subblock to identify overlapping beginning characters; and assigning a number to a compressed data entry for the data entry, when one or more overlapping characters are identified.

12. The method of claim 11, wherein the plurality of subblocks and the plurality of page blocks are in a lexical order.

13. The method of claim 11, further comprising:

upon determining that the data entry is not the first data entry in the subblock and comparing the data entry to the previous data entry in the subblock to identify overlapping beginning characters:

assigning a number zero to a prefix of the compressed data entry, when no overlapping beginning characters are identified;

assigning the number of overlapping characters to the prefix, when one or more overlapping characters are identified;

placing a number in the compressed data entry for characters other than the overlapping characters in the data entry; and listing the characters other than the overlapping characters in the compressed data entry; and determining if the data entry is the first data entry in a subblock and if yes, assigning a number of characters in the data entry as a prefix for the compressed data entry.

14. The method of claim 11, wherein the plurality of subblocks and the plurality of page blocks comprise a primary file system.

15. The method of claim 14, further comprising creating a secondary data structure for temporary storage of data entries which require a change to the primary file system after the primary file system has been created.

16. The method of claim 15, further comprising:
receiving a request to perform a search for a value in the dataset, the request including an ID;
determining if the ID is in a range of IDs assigned to the primary file system;
upon determining that the ID is in a range of IDs assigned to the primary file system:
performing a binary search to locate the page block and the subblock in which the value is located;
upon locating the subblock in which the value is located, performing a sequential search of the subblock to locate the value; and
upon determining that the ID is outside the range of IDs assigned to the primary file system, performing a search of the secondary structure to locate the value.

17. A non-transitory computer readable medium on which are stored instructions that, when executed, cause a programmable device to:
access a plurality of data entries in a dataset;
arrange the plurality of data entries in the dataset in a lexical order;
place a predetermined number of the plurality of data entries in each of a plurality of subblocks;
perform data compression on the plurality of data entries in each of the plurality of subblocks to reduce redundancy in the plurality of data entries and create compressed data entries; and
place one or more subblocks in each of a plurality of page blocks; and
store each of the plurality of page blocks in a storage device to provide efficient searching and improved functionality for the dataset,
wherein performing data compression on the plurality of data entries in each of the plurality of subblocks comprises:
examining a data entry in a subblock to determine that the data entry is not a first data entry in the subblock;
upon determining that the data entry is not the first data entry in the subblock;
comparing the data entry to a previous data entry in the subblock to identify overlapping beginning characters; and
assigning a number to a compressed data entry for the data entry, when one or more overlapping characters are identified.

18. The computer readable medium of claim 17, wherein the instructions further cause the programmable device to:
upon determining that the data entry is not the first data entry in the subblock and comparing the data entry to the previous data entry in the subblock to identify overlapping beginning characters:
assign a number zero a prefix of the compressed data entry, when no overlapping beginning characters are identified;
assign the number of overlapping characters to the prefix, when one or more overlapping characters are identified;
place a number in the compressed data entry for characters other than the overlapping characters in the data entry; and
list the characters other than the overlapping characters in the compressed data entry; and
determining if the data entry is the first data entry in a subblock and if yes, assigning a number of characters in the data entry as a prefix for the compressed data entry.

19. The computer readable medium of claim 17, wherein the plurality of subblocks and the plurality of page blocks comprise a primary file system.

20. The computer readable medium of claim 19, wherein the instructions further cause the programmable device to:
create a secondary data structure for temporary storage of data entries which require a change to the primary file system after the primary file system has been created.

* * * * *